(12) United States Patent
Hakamata et al.

(10) Patent No.: US 7,745,806 B2
(45) Date of Patent: Jun. 29, 2010

(54) SOLID-STATE RADIATION IMAGE DETECTOR

(75) Inventors: Kazuo Hakamata, Kanagawa-ken (JP); Yuichi Hosoi, Kanagawa-ken (JP); Kenji Matsumoto, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 376 days.

(21) Appl. No.: 11/774,902

(22) Filed: Jul. 9, 2007

(65) Prior Publication Data

US 2008/0197305 A1 Aug. 21, 2008

(30) Foreign Application Priority Data

Jul. 7, 2006 (JP) .............................. 2006-187930

(51) Int. Cl.
*G01N 23/04* (2006.01)
(52) U.S. Cl. ..................................... 250/580
(58) Field of Classification Search ................
250/370.01–370.15, 367; 378/98.8, 19
See application file for complete search history.

(56) References Cited

U.S. PATENT DOCUMENTS 5,041,729 A * 8/1991 Takahashi et al. ...... 250/370.11
6,268,614 B1 7/2001 Imai
6,376,857 B1 4/2002 Imai
2003/0136914 A1* 7/2003 Shoji ....................... 250/370.1

FOREIGN PATENT DOCUMENTS

JP 01-216290 8/1989
JP 02-164067 6/1990

* cited by examiner

*Primary Examiner*—David P Porta
*Assistant Examiner*—Kiho Kim
(74) *Attorney, Agent, or Firm*—Sughrue Mion, PLLC

(57) ABSTRACT

A solid-state radiation detector with increased pixel density. The solid-state radiation detector includes multitudes of linear signal wires for detecting recorded image information as image signals, and a signal detection means disposed on an opposing side of the detector substantially orthogonal to the linear signal wires, and connected to the linear signal wires to detect the image signals from the linear signal wires. A connection section of each of the linear signal wires, extending substantially orthogonal to the opposing side, for connection to the signal detection means is disposed such that the distance from the opposing side to each of the connection sections differs with each other.

6 Claims, 6 Drawing Sheets

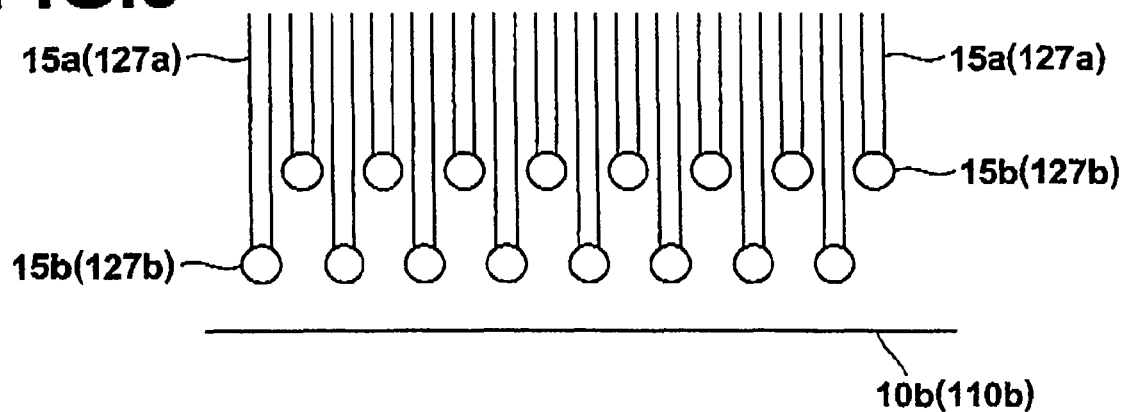
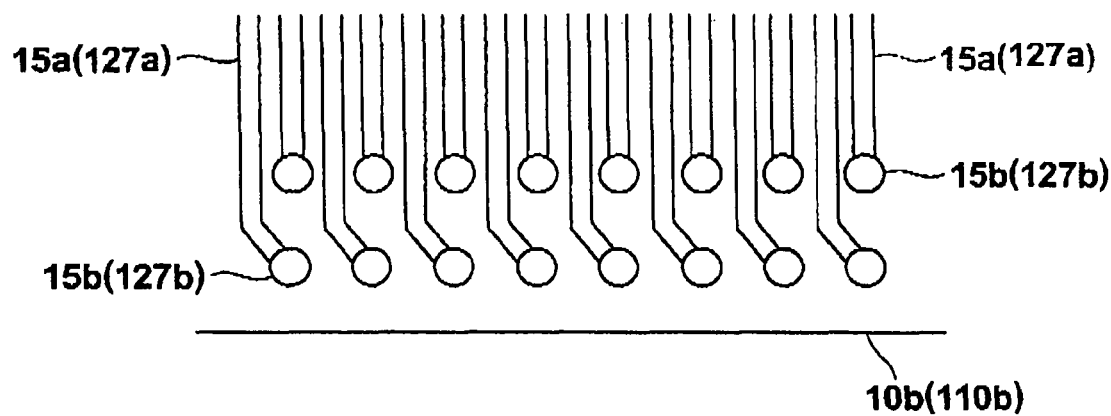
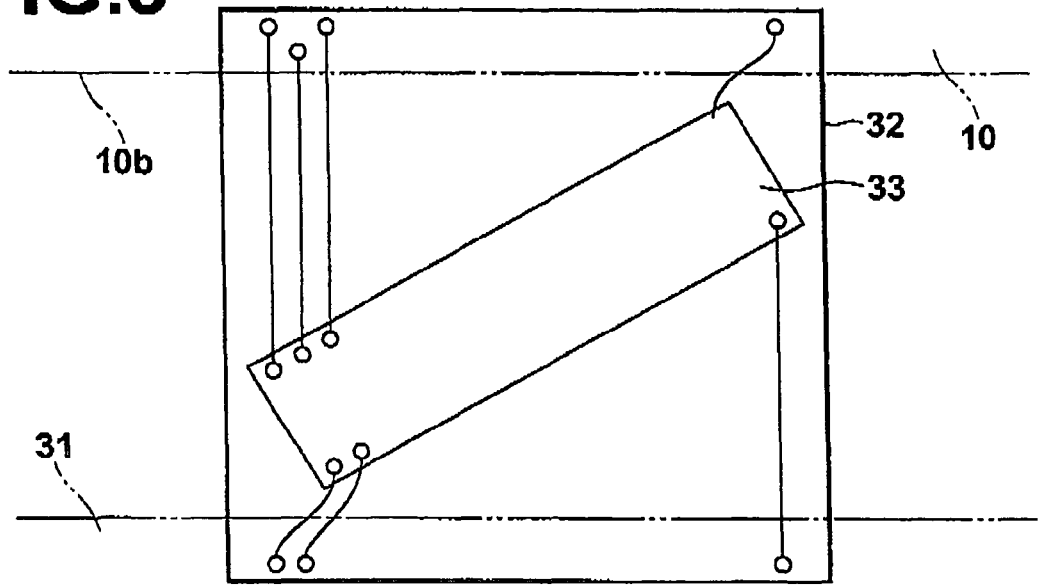

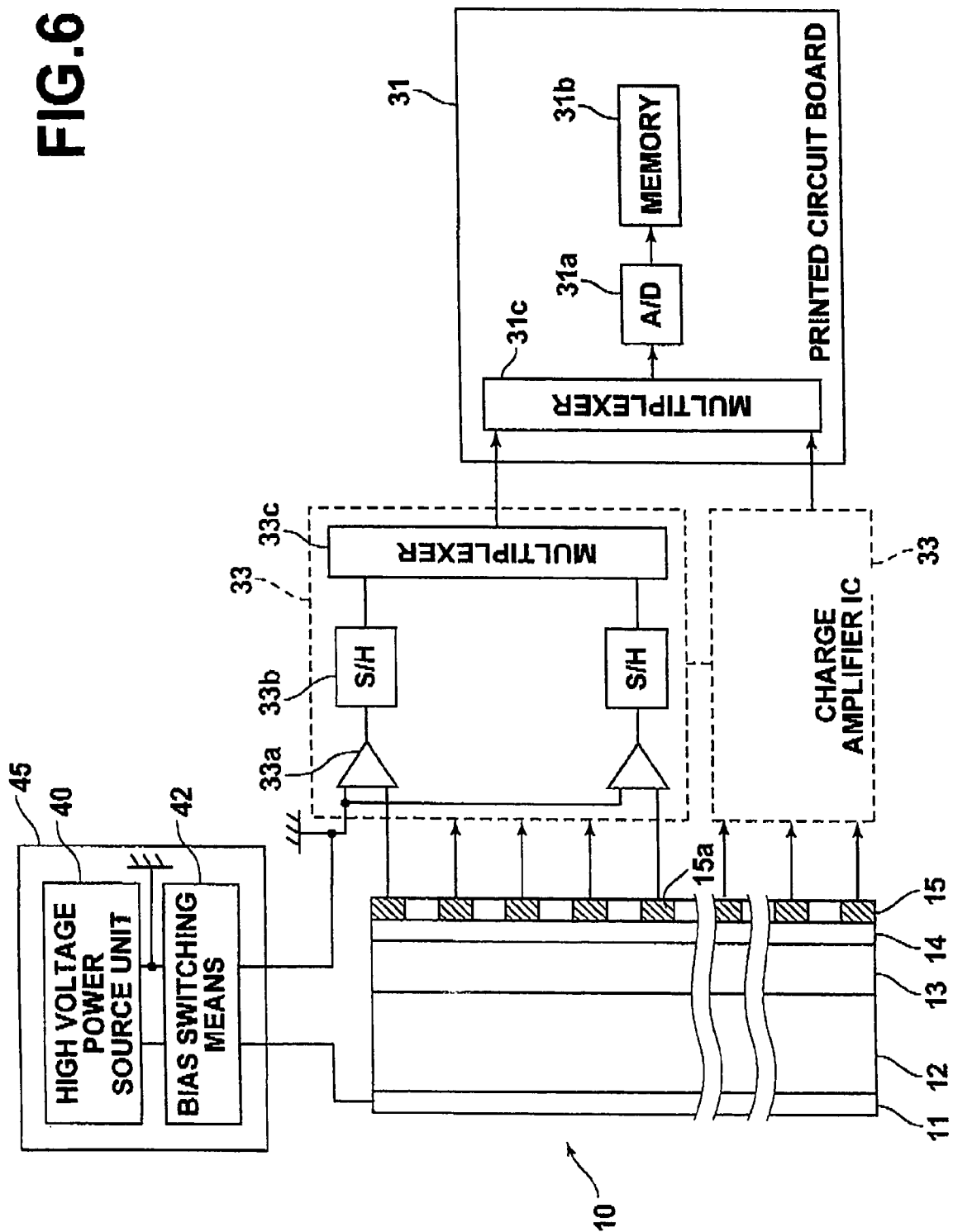

SOLID-STATE RADIATION IMAGE DETECTOR

BACKGROUND OF THE INVENTION

1. Field of the Invention

The present invention relates to a solid-state radiation detector constructed to receive radiation representing image information to record the image information therein, and to output image signals representing the recorded image information.

2. Description of the Related Art

Today, in radiological imaging for medical diagnosis, a variety of solid-state radiation detectors is proposed and put into practical use. Such detectors are constructed to tentatively store charges in a storage section of a solid-state detection element obtained by detecting radiation, and to output the stored charges after converting to image signals representing radiation image information. For example, from the aspect of charge generation process in which radiation is converted to charges, two types of solid-state radiation image detectors are proposed, one of which is called an optical conversion type and the other of which is called a direct conversion type. From the aspect of charge readout process in which stored charges are read out, two types of solid-state radiation image detectors are proposed, one of which is called a TFT (thin film transistor) readout type and the other of which is called an optical readout type.

Here, the optical conversion solid-state radiation detector includes, for example: a solid-state detection unit (image readout unit) including multitudes of photoelectric conversion elements (solid-state detection elements) formed in a matrix on an insulative substrate; and a phosphor stacked on the solid-state detection unit, thereby fluorescence emitted from the phosphor when radiation is irradiated thereon is detected by the photoelectric conversion elements, and signal charges obtained through the photoelectric conversion are tentatively stored in the storage sections of the photoelectric conversion elements (normally, in the case of optical conversion type, the photoelectric conversion section also serves as the storage section), then the stored signal charges are converted to image signals (electrical signals) and outputted, as described, for example, in Japanese Unexamined Patent Publication No. 2(1990)-164067.

The direct conversion solid-state radiation detector includes, for example, a solid-state detection unit including multitudes of charge collection electrodes formed in a matrix on an insulative substrate, and a radiation conductor, stacked on the charge collection electrodes, that receives radiation to generate charges representing radiation information, thereby signal charges generated in the radiation conductor when radiation is irradiated thereon are collected by the charge collection electrodes and tentatively stored in the storage sections, then the stored signal charges are converted to electrical signals and outputted as described, for example, in Japanese Unexamined Patent Publication No. 1(1989)-216290.

The TFT readout method is a method in which signal charges stored in the storage sections of the solid-state detection elements are read out by scan-driving TFTs connected to the storage sections, and the optical readout method is a method in which the signal charges are read out by irradiating readout light (readout electromagnetic wave) on the solid-state detection elements.

Further, the inventor of the present invention has proposed improved direct conversion solid-state radiation detectors as described, for example, in U.S. Pat. Nos. 6,268,614 and 6,376,857. The improved direct conversion solid-state radiation detectors are direct conversion and optical readout type solid-state radiation detectors. These detectors include the following in the order listed below: a first conductive layer which is transparent to recording radiation; a recording photoconductive layer which shows photoconductivity (more precisely, radiation conductivity) when irradiated by the recording radiation transmitted through the first conductive layer; a charge transport layer acting as substantially an insulator against charges having the same polarity as charges charged on the first conductive layer and as substantially a conductor for charges having the opposite polarity; a readout photoconductive layer which shows photoconductivity (more precisely, electromagnetic wave conductivity) when irradiated by a readout electromagnetic wave; and a second conductive layer which is transparent to the readout magnetic wave. Here, signal charges (latent image charges), representing image information, are stored in the interface (storage sections) between the recording photoconductive layer and charge transport layer.

The image signals outputted from the solid-state radiation image detectors of various types described above are outputted to outside, then subjected to various kinds of signal processing by a signal processing unit in the subsequent stage, and outputted as visible information through an output means such as a CRT, or the like. In this way, the use of the solid-state radiation detector allows image signals representing radiation image of a subject to be obtained and immediately outputted as a visible image or the like.

In the solid-state radiation detector described above, the solid-state radiation detector is connected to a substrate on which a signal detection circuit is provided through a TAB (Tape Automated Bonding) film. As illustrated in FIG. 12, in elements 200, which are linear wires, connection sections 201 for connecting the elements 200 to the TAB are disposed in a line, so that a pitch of the elements 200 is the same as a pitch of the connection sections 201. Here, the pixel density of the detector may be increased by narrowing the pitch of the elements 200. The connection sections 201, however, need to be formed with a greater width than that of the elements 200 for structural reasons, so that elements 200 may not be formed with a narrower pitch than that of the connection sections 201, which has limited the pixel density.

SUMMARY OF THE INVENTION

The present invention has been developed in view of the circumstances described above, and it is an object of the present invention to provide a solid-state radiation detector with increased pixel density.

The solid-state radiation detector according to the present invention is a solid-state radiation detector constructed to receive radiation representing image information to record the image information therein, and to output image signals representing the recorded image information, the detector including:

multitudes of linear signal wires for detecting the recorded image information as image signals; and a signal detection means disposed on an orthogonal side of the detector substantially orthogonal to the linear signal wires, and connected to the linear signal wires to detect the image signals from the linear signal wires, wherein the distance from the orthogonal side to a connection section of each of adjacent linear signal wires of the multitudes of linear signal wires for connection to the signal detection means differs with each other.

Specific methods for making an arrangement in which "the distance from the orthogonal side to a connection section of each of adjacent linear signal wires for connection to the signal detection means differs with each other" may include a method in which the connection section between each of the linear signal wires and the signal detection means is disposed such that the distance from the orthogonal side to each of the connection sections differs alternately, a method in which the connection sections of adjacent linear signal wires are disposed such that the positions of the connection sections are arranged in multi-rows, and the like.

Here, if the distance from the orthogonal side to the connection section between each of the multitudes of linear signal wires and the signal detection means differs alternately, the connection section closer to the orthogonal side may be located on an extended line of the linear signal wire connected to the connection section remote from the orthogonal side, and the linear signal wire to be connected to the connection section closer to the orthogonal side may be bent so as to be connected to the connection section closer to the orthogonal side.

In the solid-state radiation detector of the present invention, the signal detection means may include a signal detection integrated circuit, which includes an array of connection terminals disposed inclined with respect to the orthogonal side, and the connection terminals may be connected to the linear signal wires.

The solid-state radiation detector of the present invention may further include:

multitudes of linear scanning wires, which extend in a direction substantially orthogonal to the linear signal wires, for outputting the recorded image information as the image signals; and a scanning control means connected to the linear scanning wires to send a signal for outputting the image signals.

In this case, a configuration may be adopted in which the distance from another orthogonal side, which is substantially orthogonal to the linear scanning wires, to a connection section of each of adjacent linear scanning wires of the multitudes of linear scanning wires for connection to the scanning control means differs with each other.

Specific methods for making an arrangement in which "the distance from the another orthogonal side to a connection section of each of adjacent linear scanning wires for connection to the scanning control means differs with each other" may include a method in which the connection section between each of the linear scanning wires and the scanning control means is disposed such that the distance from the another orthogonal side to each of the connection sections differs alternately, a method in which the connection sections of adjacent linear signal wires are disposed such that the positions of the connection sections are arranged in multi-rows, and the like.

Here, if the distance from the another orthogonal side to the connection section between each of the multitudes of linear scanning wires and the scanning control means differs alternately, the connection section closer to the another orthogonal side may be located on an extended line of the linear scanning wire connected to the connection section remote from the another orthogonal side, and the linear scanning wire to be connected to the connection section closer to the another orthogonal side may be bent so as to be connected to the connection section closer to the another orthogonal side.

In the solid-state radiation detector of the present invention, the referent of "substantially orthogonal" means to include not only crossing at right angle but also crossing at an angle deviated within several degrees from 90 degrees. Further, "substantially parallel" as used herein means to include not only absolute parallel but also arrangement within several degrees of deviation from absolute parallel.

According to the solid-state radiation detector of the present invention, the distance from an orthogonal side substantially orthogonal to linear signal wires to a connection section of each of adjacent linear signal wires for connection to the signal detection means differs with each other. This allows the spacing between the linear signal wires to be made narrower in comparison with the case in which the connection sections are arranged in a straight line. Thus, pixel density of the solid-state radiation detector may be increased.

In particular, arrangement of connection sections of adjacent linear scanning wires for connection to the scanning control means such that the distance from another orthogonal side to each of the connection sections differs with each other allows the spacing between the linear scanning wires to be made narrower in comparison with the case in which the connection sections are arranged in a straight line. Thus, pixel density of the solid-state radiation detector may be increased.

Further, by disposing the signal detection integrated circuit inclined with respect to the orthogonal side of the detector substantially orthogonal to the linear signal wires, and connecting the connection terminals of the integrated circuit to the linear signal wires, increased number of terminals may be provided for the integrated circuit, which may meet the increase in the number of linear signal wires.

BRIEF DESCRIPTION OF THE DRAWINGS

FIG. 3 illustrates an example arrangement of connection sections of elements on a TAB film.

FIG. 4 illustrates another example arrangement of the connection sections of the elements on the TAB film.

FIG. 5 illustrates an example arrangement of a charge amplifier IC on the TAB film.

FIG. 6 is a block diagram illustrating in detail the charge amplifier ICs, printed circuit board, high-voltage power source unit, and the aspect of connection thereof with the solid-state radiation detector.

DESCRIPTION OF THE PREFERRED EMBODIMENTS

Figure 1:
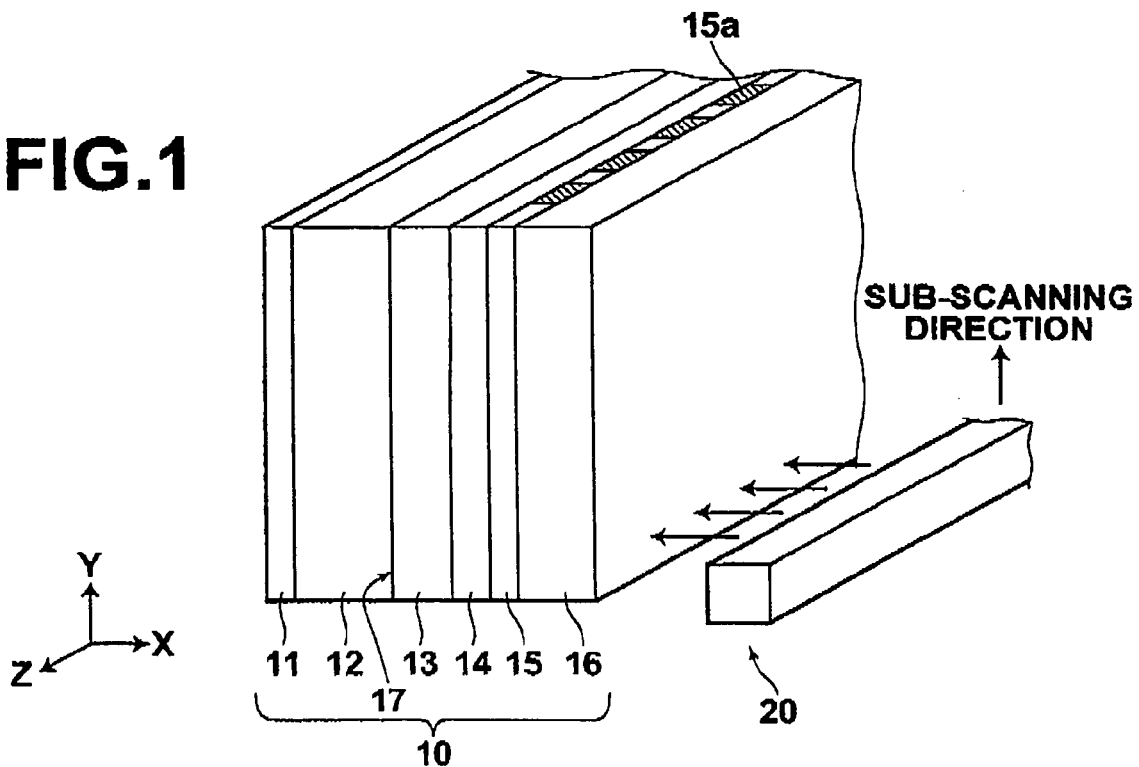
FIG. 1 is a schematic view of the solid-state radiation detector according to a first embodiment of the present invention.

Hereinafter, exemplary embodiments of the present invention will be described with reference to the accompanying drawings. FIG. 1 is a schematic view of the solid-state radiation detector according to a first embodiment of the present invention. As illustrated, the solid-state radiation detector 10 is, for example, a direct conversion and optical readout type solid-state radiation detector for mammography, which receives radiation representing image information to record the image information therein as an electrostatic latent image, and generates electric currents according to the electrostatic latent image when scanned with readout light.

As illustrated in FIG. 1, the solid-state radiation detector 10 includes a glass substrate 16 on which the following layers are stacked in the order listed below: a first conductive layer 11 which is transparent to radiation (recording light) transmitted through a test subject 8; recording photoconductive layer 12 which generates charges and shows photoconductivity when irradiated by the recording light; a charge transport layer 13 acting as substantially an insulator against latent image polarity charges charged on the first conductive layer, and as substantially a conductor for transport polarity charges having the opposite polarity to the latent image polarity charges; a readout photoconductive layer 14 which generates charges and shows photoconductivity when irradiated by readout light; and a second conductive layer 15 which is transparent to the readout light. Here, a storage section 17 is formed at the interface between the recording photoconductive layer 12 and charge transport layer 13.

The first conductive layer 11 and second conductive layer 15 include electrodes. The electrode of the first conductive layer 11 is a plate electrode, and the electrode of the second conductive layer 15 is a stripe electrode having multitudes of elements 15a (linear signal wires) arranged in stripes at a pixel pitch (reference is made to, for example, electrostatic recording medium as described in U.S. Pat. No. 6,268,614). Note that the element 15a is a linear electrode extending directly to the connection section. Further, the arrangement direction of the elements 15a corresponds to the main scanning direction and the longitudinal direction of the elements 15a corresponds to the sub-scanning direction.

The size of the solid-state radiation detector 10 is, for example, 24 cm (long sides)×18 cm (short sides), and the detector 10 is accommodated in an imaging platform (not shown) for performing imaging, with the long side direction corresponding to the main scanning direction and short side direction corresponding to the sub-scanning direction. Note that a solid-state radiation detector with a size of 30 cm (long sides)×24 cm (short sides) may also be used.

As for the readout exposure light source unit 20, a unit which includes a line light source constituted by a plurality of LED chips arranged in a line, and an optical system for irradiating light outputted from the light source on the solid-state radiation detector 10 in a line is used. The whole area of the solid-state radiation detector 10 is exposed by moving the light source 20 in the longitudinal direction of the elements 15a of the solid-state radiation detector 10, i.e., the sub-scanning direction by a moving means, which includes a linear motor, with a necessary distance maintained between the light source 20 and solid-state radiation detector 10.

Figure 2:
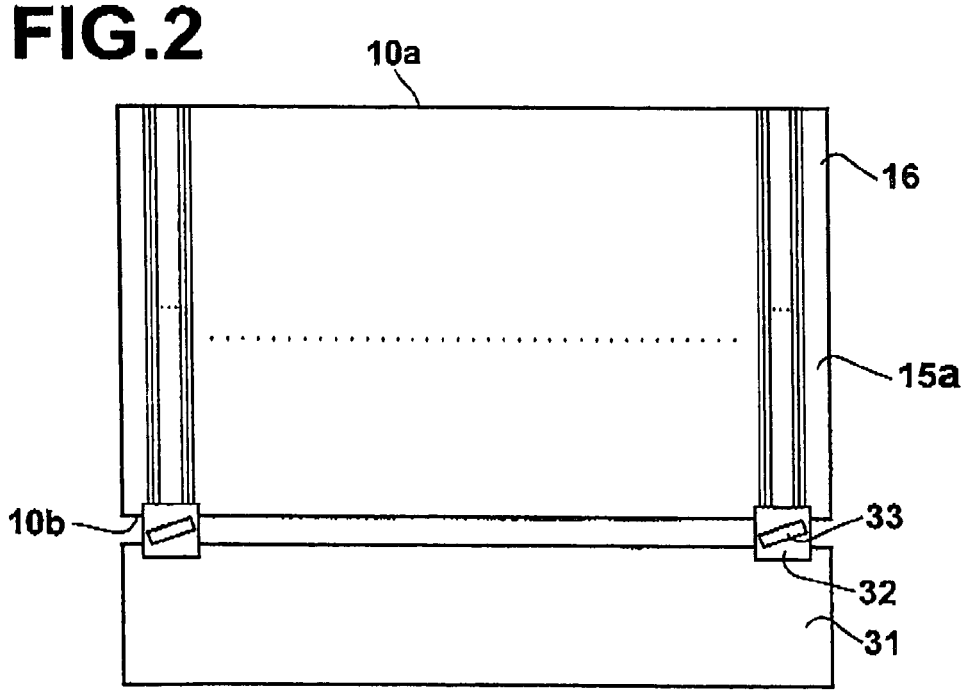
FIG. 2 illustrates in detail the aspect of connection of the solid-state radiation detector with a printed circuit board.

FIG. 2 illustrates in detail the aspect of connection of the solid-state radiation detector with a printed circuit board. As illustrated, each of the elements 15a of the solid-state radiation detector 10 is connected to a charge amplifier IC 33 through a printed pattern (not shown) formed on a TAB (Tape Automated Bonding) film 32, and the charge amplifier IC 33 is connected to a printed circuit board 31 through a printed pattern (not shown) on the TAB film 32 at the opposing side 10b of the detector 10 opposite to the test subject side 10a thereof facing a test subject. The elements 15a extend in a direction substantially orthogonal to the test subject side 10a and opposing side 10b. In the present embodiment, several to several tens of charge amplifier ICs are provided in total, instead of connecting all of the elements 15a to a single charge amplifier IC, and a group of adjacent several to approximately hundred of elements 15a is connected to each charge amplifier IC.

Note that an alternative arrangement known as COG (Chip On Glass) may be adopted, in which the charge amplifier ICs are formed on the glass substrate 16, instead of on the TAB film. Further, the charge amplifier ICs may be formed on the printed circuit board 31.

FIG. 3 illustrates an example arrangement of connection sections 15b of the elements 15a on the TAB film 32. As illustrated, the connection sections 15b of the elements 15a are arranged such that adjacent connection sections 15b differ with each other in the distance from the opposing side 10b. That is, the connection sections 15b are disposed such that the distances thereof from the opposing side 10b differ alternately. Note that an arrangement may be adopted in which adjacent two connection sections 15b of the elements 15a are disposed on a straight line, which is orthogonal to the opposing side 10b, by bending the element 15a disposed closer to the opposing side 10b, as illustrated in FIG. 4.

FIG. 5 illustrates an example arrangement of the charge amplifier IC 33 on the TAB film 32. As illustrated, the charge amplifier IC 33 is disposed on the TAB film 32 such that the side having connection terminals is inclined with respect to the opposing side 10b of the solid-state radiation detector 10, and the connection terminals of the IC 33 are connected to the connection sections 15b. This arrangement allows increased number of connection terminals for the charge amplifier IC 33 to be provided in comparison with the case in which the charge amplifier IC 33 is disposed with the longitudinal direction thereof parallel to the opposing side 10b.

Where the charge amplifier ICs are formed on the glass substrate 16 or printed circuit board 31, each of the charge amplifier ICs may also be disposed inclined with respect to the opposing side 10b of the solid-state radiation detector 10, as in FIG. 5.

FIG. 6 is a block diagram illustrating in detail the charge amplifier ICs 33, printed circuit board 31, high-voltage power source unit 45, and the aspect of connection thereof with the solid-state radiation detector 10.

The high-voltage power source unit 45 is a circuit that integrates a high-voltage power source 40 and a bias switching means 42 together. The high-voltage power source 40 is connected to the electrostatic recording unit 10 through the bias switching means 42 for switching between application of bias voltage to the electrostatic recording unit 10 and grounding of the electrostatic recording unit 10, or the like. The circuit is designed to limit charge/discharge surge current values at the time of switching in order to prevent damages to the portions of the apparatus where currents are concentrated.

The charge amplifier IC 33 provided on the TAB film 32 includes multitudes of charge amplifiers 33a, each connected to each of the corresponding group of elements 15a of the solid-state radiation detector 10, multitudes of sample-and-holds (S/Hs) 33b, each connected to each charge amplifier 33a, and a multiplexer 33c for multiplexing a signal from each sample-and-hold 33b. Currents flowing out from the solid-state radiation detector 10 are converted to voltages by charge amplifiers 33a, and the voltages are sample held at a predetermined timing by the sample-and-holds 33b, then the sample held voltages corresponding to the respective elements 15a of the group are sequentially outputted from the multiplexer 33c in the arrangement order of the elements 15a (corresponding to a portion of the main scanning). Signals sequentially outputted from the multiplexer 33c are inputted to the multiplexer 31c provided on the printed circuit board 31, and voltages corresponding to the respective elements 15a are sequentially outputted from the multiplexer 31c in the arrangement order of the elements 15a, thereby the main scanning is completed. The signals sequentially outputted from the multiplexer 31c are converted to digital signals by the A/D conversion unit 31a, and the digital signals are stored in the memory 31b.

As described above, in the first embodiment, connection sections 15b for connecting the elements 15a to the TAB film are arranged such that positions of adjacent connection sections 15b differ with each other in the distance from the opposing side 10b of the solid-state radiation detector 10, as illustrated in FIGS. 3 and 4. This allows the spacing between the elements 15a to be made narrower in comparison with the case in which the connection sections 15b are arranged in a straight line. Thus, pixel density of the solid-state radiation detector 10 may be increased.

Figure 7:
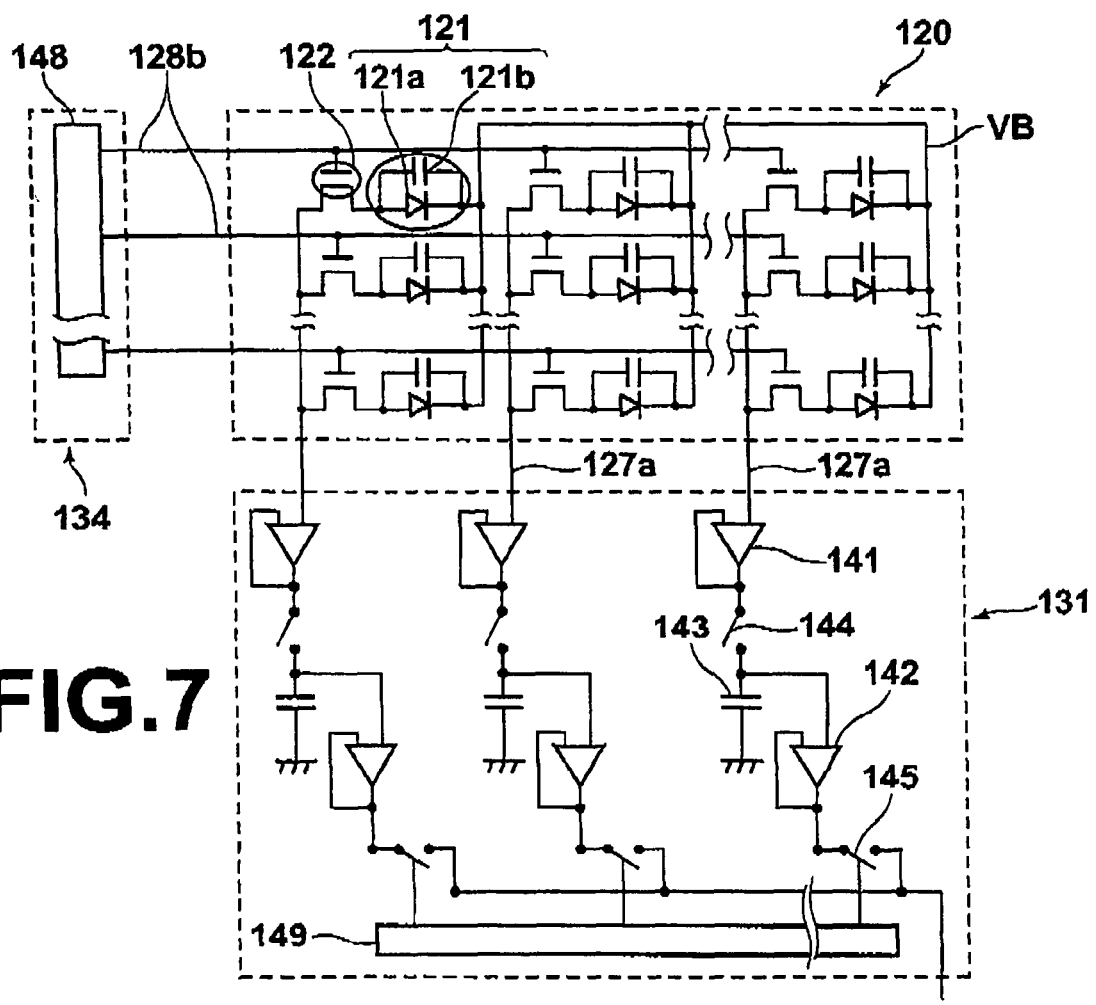
FIG. 7 is a schematic view of the solid-state radiation detector according to a second embodiment of the present invention (first case).
Figure 8:
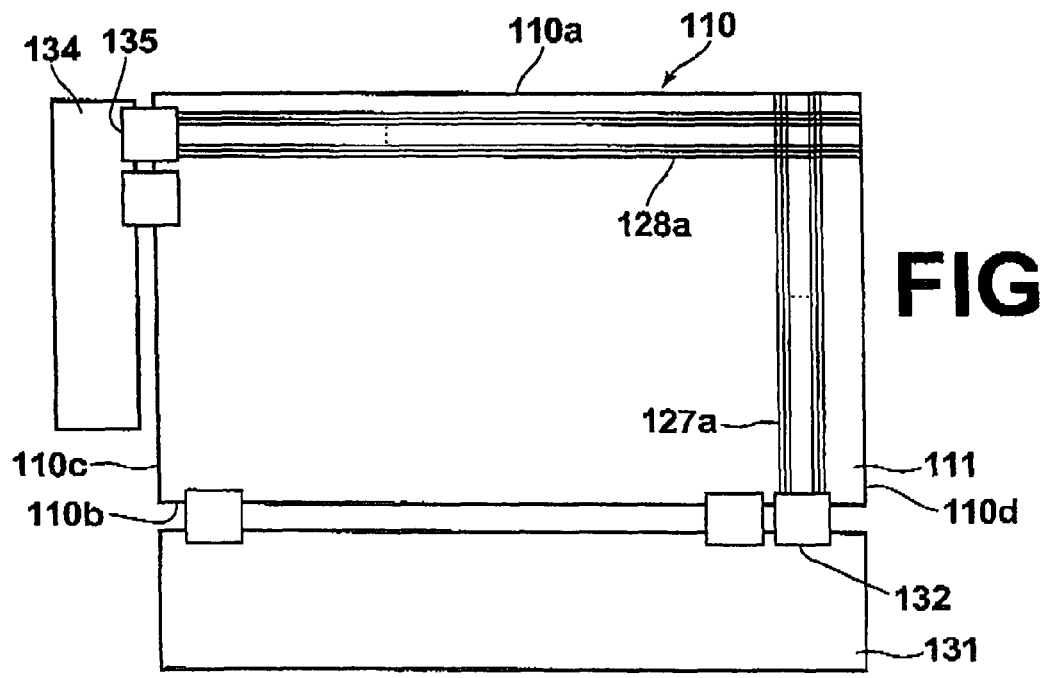
FIG. 8 illustrates in detail the aspect of connection of the solid-state radiation detector with a printed circuit board.

Next, a second embodiment of the present invention will be described. The type of solid-state radiation detector in the second embodiment differs from that of the first embodiment. FIG. 7 is a schematic view of the solid-state radiation detector according to the second embodiment. FIG. 8 illustrates in detail the aspect of connection of the solid-state radiation detector with a printed circuit board.

The solid-state radiation detector 110 according to the second embodiment is an optical conversion and TFT readout type solid-state radiation detector, which does not require scanning of readout light when reading out an electrostatic latent image; instead it is read out electrically.

The solid-state radiation detector 110 includes a solid-state detection unit 120, formed on a glass substrate 111, for detecting radiation.

The solid-state detection unit 120 includes photoelectric conversion elements 121, acting as solid-state detection elements, and transfer sections 122 arranged in a matrix. Each photoelectric conversion elements 121 includes a photoelectric conversion section 121a and a storage section 121b, and each transfer section 122 includes a TFT for transferring signal charges stored in the storage section 121b. Note that, in the solid-state detection unit 120, a bias voltage is applied to the wire VB from a not shown power source unit.

The size of the solid-state radiation detector 110 is 24 cm (long sides)×18 cm (short sides), and the detector 110 is accommodated in an imaging platform (not shown) with the long side direction corresponding to the main scanning direction and short side direction corresponding to the sub-scanning direction. Note that a solid-state radiation detector with a size of 30 cm (long sides)×24 cm (short sides) may also be used.

As illustrated in FIG. 8, multitudes of elements (linear signal wires) 127a for detecting image information recorded in the solid-state radiation detector 110 as image signals are grouped into several to approximately hundred adjacent elements, and each group of elements is connected to a printed circuit board 131 through a printed pattern (not shown) formed on a TAB film 132 at the opposing side 110b of the detector 110 opposite to the test subject side 110a thereof facing a test subject. The elements 127a extend in a direction substantially orthogonal to the test subject side 110a and opposing side 110b. Further, the opposing side 110b corresponds to the orthogonal side of the present invention.

Further, connection sections 127b of the elements 127a are arranged such that adjacent connection sections 127b differ with each other in the distance from the opposing side 110b, as in the first embodiment illustrate in FIG. 3. Note that one of two adjacent elements 127a with the connection section 127b disposed closer to the opposing side 110b may be bent as illustrated in FIG. 4.

Further, elements (linear scanning wires) 128a of the solid-state radiation detector 110 are grouped into several to approximately hundred adjacent elements, and each group of elements is connected to a printed circuit board 134 through printed patterns (not shown) formed on TAB films 135 at an orthogonal side 110c orthogonal to the opposing side 110b. The elements 128a extend in a direction substantially parallel to the test subject side 110a and opposing side 110b (i.e., substantially orthogonal to the orthogonal sides 110c and 110d). Further, the orthogonal side 110c corresponds to the another orthogonal side of the present invention.

Figure 9:
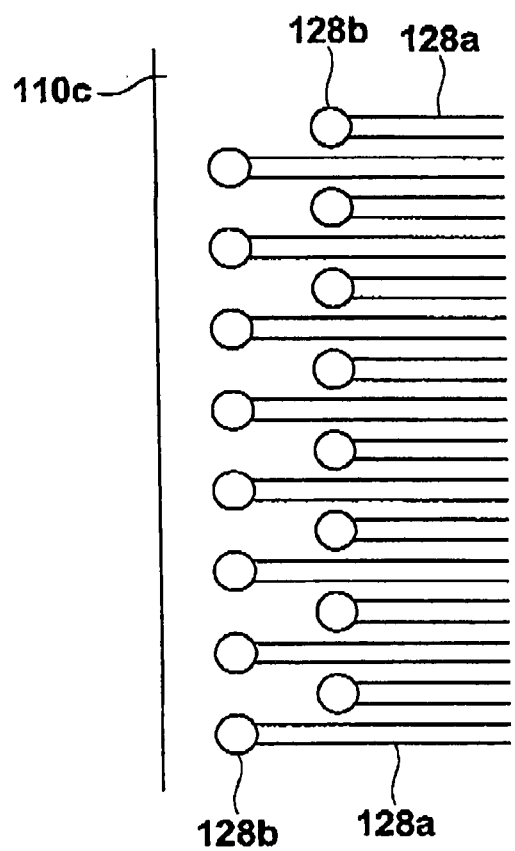
FIG. 9 illustrates an example arrangement of connection sections of elements on a TAB film.

Further, connection sections 128b of the elements 128a are arranged such that adjacent connection sections 128b differ with each other in the distance from the orthogonal side 110c, as illustrated in FIG. 9. Note that one of two adjacent elements 128a with the connection section 128b disposed closer to the orthogonal side 110c may be bent as illustrated in FIG. 4.

The printed circuit board 131 includes: a charge amplifier 141 for reading out signal charges transferred from the solid-state detection unit 120 on a column-by-column basis through the element 127a to outside; a capacitor 143; a switch 144 connected to the charge amplifier 142 and capacitor 143; a buffer amplifier 142; a switch 145 connected to the buffer amplifier 142; a shift register 149 including a main scanning pulse generator; an A/D conversion unit (not shown); and a memory (not shown). The number of charge amplifiers 141, capacitors 143, or the like corresponds to the number of vertical columns of the photoelectric conversion elements 121. Switches 144 and 145 are connected to the shift register 149, acting as a main scanning means.

The printed circuit board 134 includes a sub-scanning pulse generator 148 commonly connecting the photoelectric conversion elements 121 with respect to each row through the gates of the TFTs and each element 128a.

A not shown phosphor is provided on the radiation detection face side of the solid-state detection unit 120, and when radiation transmitted through a test subject (e.g., a breast) is irradiated on the phosphor, luminescence is emitted from the phosphor according to the dose of radiation, thereby charges are generated in the photoelectric conversion sections 121a according to the dose of radiation, and stored in the storage sections 121b. Then, when elements 128a are sequentially turned on, from the top element 128a in FIG. 7, to turn on the transfer sections 122 connected to each element 128a, charges stored in the storage sections 121b with respect to each line (charges of one line at a time) are converted to voltage signals through the charge amplifier and send to the capacitor 143. The voltage signals stored in the capacitor 143 are read out by the switch 145 through the buffer amplifier 142. A switching over of the switches 145 is implemented by the shift register 149, and thereby the parallel signals are converted to serial signals, which are outputted to the A/D conversion unit, where the image signals are converted to digital image signals, and stored in the memory. Here, with respect to each line, the switches 145 are sequentially switched by the shift register 149 to output the image signals of the single line to the A/D conversion unit, thereby a line readout for signal charges generated in the solid-state detection unit 120 is performed.

The second embodiment constructed in the manner as described above may provide identical effects to the first embodiment.

In the second embodiment, only a printed pattern is formed on the TAB film 32, the charge amplifier IC 33 may be provided on the TAB film 32, as in the first embodiment. In this case, it is preferable that the charge amplifier 33 be inclined with respect to the opposing side 110*b*, as in the first embodiment. Further, in this case, the charge amplifiers 141, buffer amplifiers 142, capacitors 143, switches 144 and 145, and shift register 149 are not required on the printed circuit board 131. Alternatively, charge amplifiers 33 may be provided on the printed circuit board 131, instead of the charge amplifiers 141, butter amplifiers 142, capacitors 143, switches 144 and 145, and shift register 149.

Figure 10:
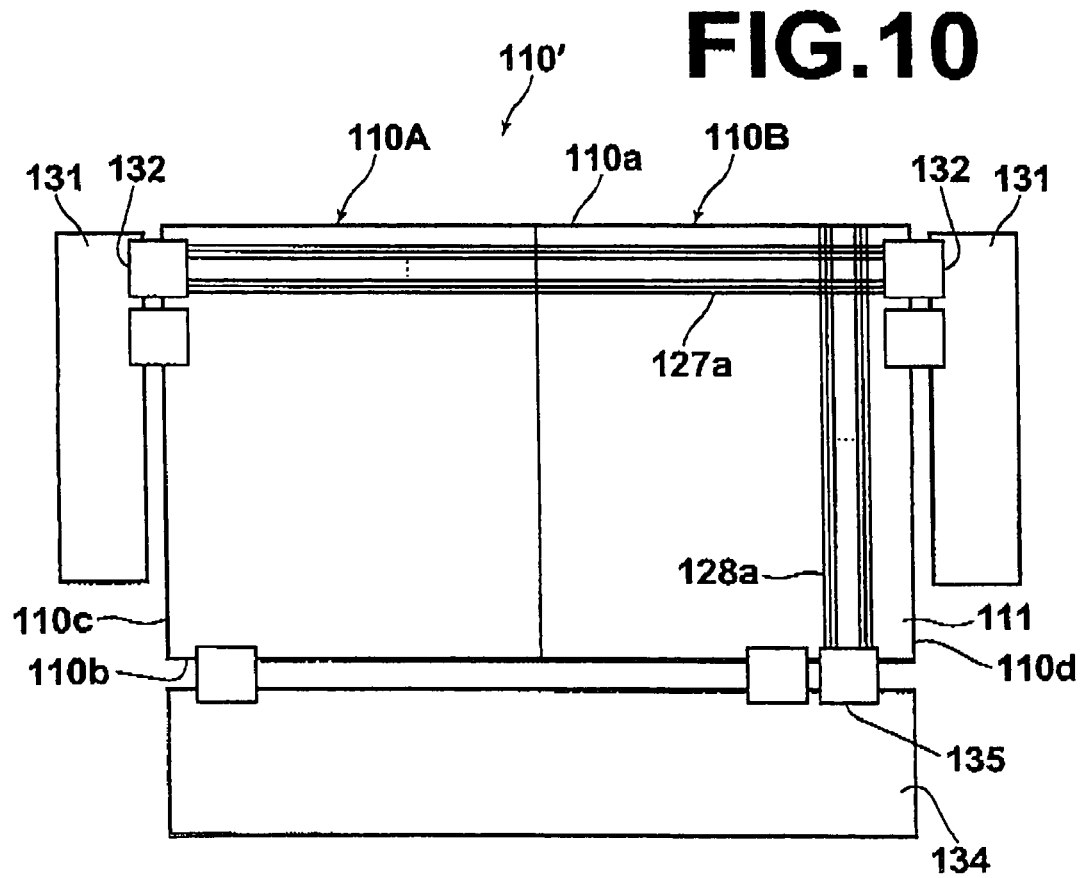
FIG. 10 is a schematic view of the solid-state radiation detector according to a second embodiment of the present invention (second case).

Further, in the second embodiment, the solid-state radiation detector 110' may include two solid-state radiation detectors 110A, 110B, as illustrated in FIG. 10. In the solid-state radiation detector shown in FIG. 10, the elements 127*a* are disposed in a direction substantially orthogonal to the orthogonal sides 110*c* and 110*d*, and the elements 128*a* are disposed in a direction substantially orthogonal to the opposing side 110*b*, unlike the solid-state radiation detector shown in FIG. 8. In addition, the printed circuit boards 131 are connected through the TAB films 132 at the orthogonal sides 110*c*, 110*d*, and the printed circuit board 134 is connected through the TAB films 135 at the opposing side 110*b*, in line with this configuration.

Figure 11:
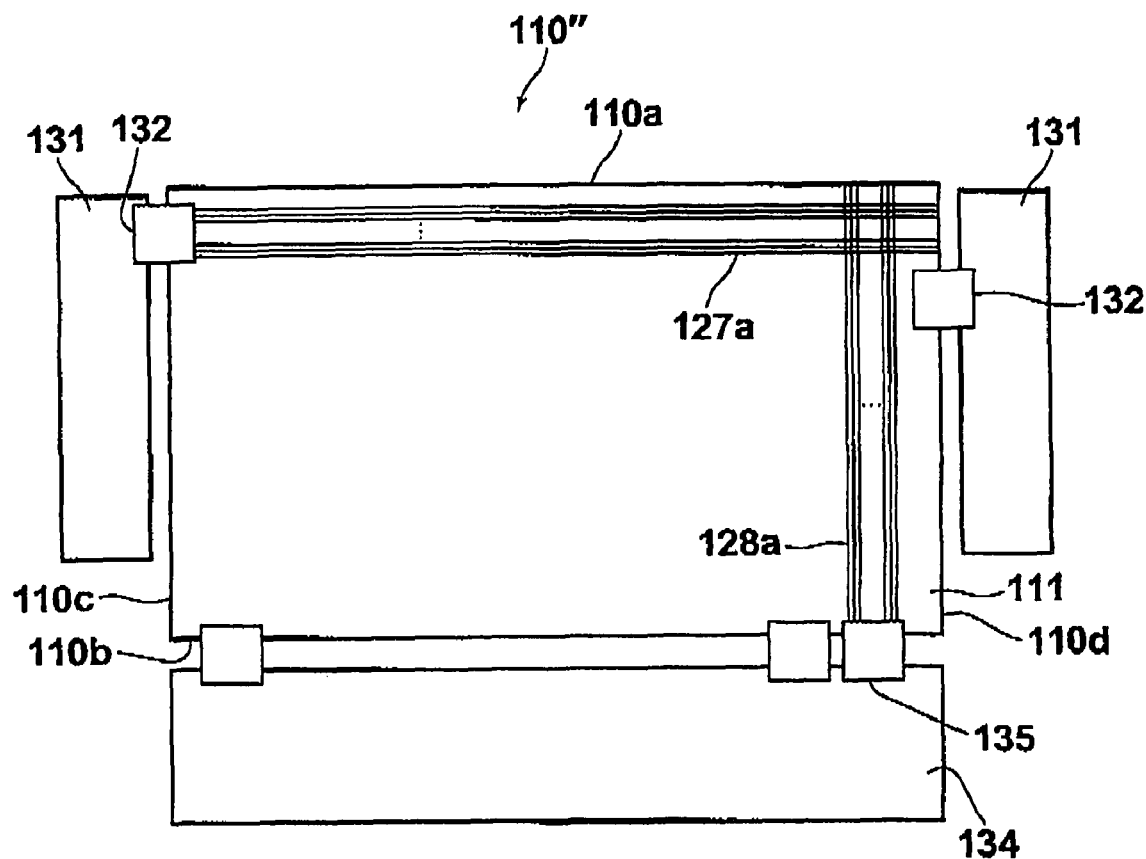
FIG. 11 is a schematic view of the solid-state radiation detector according to a second embodiment of the present invention (third case).
Figure 12:
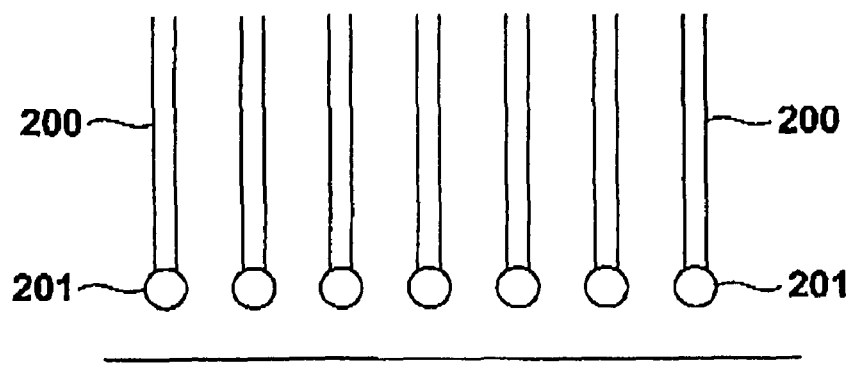
FIG. 12 illustrates an example arrangement of connection sections of elements on a TAB film according to a conventional method.

Still further, TAB films may be connected alternately at both sides for a non-divided single solid-state radiation detector 110", as illustrated in FIG. 11. In this case, if the density of the connection sections is the same, two-fold number of signal lines may be connected in comparison with the solid-state radiation detectors 110, 110' shown in FIGS. 8 and 10. Here, in the case of an optical readout type solid-state radiation detector like that illustrated in FIG. 1, the resolution of an image obtained by the detector is mainly dependent on the density of linear signal wires (since the width of the linear scanning light may be made sufficiently smaller than the spacing between the signal lines), the embodiment of the present invention is advantageous for enhancing resolution of an image obtained by the solid-state radiation image detector.

In the mean time, for the linear scanning wires, if the restriction that the connection sections are not disposed on the test subject side of a solid-state radiation detector facing a test subject, as in a solid-state radiation detector for mammography, in order to extend the imaging region to the test subject side as close as possible is not required, the printed circuit boards may be connected at both the test subject side and opposing side opposite to the test subject side, so that two-fold number of linear scanning wires may be connected. The use of the connection mode of the present invention for increasing the connection density together with the both-side connection allows formation of an unprecedented high-resolution image on a large area solid-state radiation detector.

What is claimed is:

1. A solid-state radiation detector constructed to receive radiation representing image information to record the image information therein, and to output image signals representing the recorded image information, the detector comprising:

multitudes of linear signal wires for detecting the recorded image information as image signals;

a signal detection means disposed on an orthogonal side of the detector substantially orthogonal to the linear signal wires, and connected to the linear signal wires to detect the image signals from the linear signal wires, wherein the distance from the orthogonal side to a connection section of each of adjacent linear signal wires of the multitudes of linear signal wires for connection to the signal detection means differs with each other; and further comprising:

multitudes of linear scanning wires, which extend in a direction substantially orthogonal to the linear signal wires, for outputting the recorded image information as the image signals; and a scanning control means connected to the linear scanning wires to send a signal for outputting the image signals, wherein the distance from another orthogonal side, which is substantially orthogonal to the linear scanning wires, to a connection section of each of adjacent linear scanning wires of the multitudes of linear scanning wires for connection to the scanning control means differs with each other.

2. The solid-state radiation detector according to claim 1, wherein the distance from the orthogonal side to the connection section between each of the multitudes of linear signal wires and signal detection means differs alternately.

3. The solid-state radiation detector according to claim 2, wherein the connection section closer to the orthogonal side is located on an extended line of the linear signal wire connected to the connection section remote from the orthogonal side, and the linear signal wire to be connected to the connection section closer to the orthogonal side is bent so as to be connected to the connection section closer to the orthogonal side.

4. The solid-state radiation detector according to claim 1, wherein the signal detection means comprises a signal detection integrated circuit, which includes an array of connection terminals disposed inclined with respect to the orthogonal side, and the connection terminals are connected to the linear signal wires.

5. The solid-state radiation detector according to claim 1, wherein the distance from the another orthogonal side to the connection section between each of the multitudes of linear scanning wires and scanning control means differs alternately.

6. The solid-state radiation detector according to claim 5, wherein the connection section closer to the another orthogonal side is located on an extended line of the linear scanning wire connected to the connection section remote from the another orthogonal side, and the linear scanning wire to be connected to the connection section closer to the another orthogonal side is bent so as to be connected to the connection section closer to the another orthogonal side.

* * * * *